US006627467B2

(12) United States Patent
Haluzak et al.

(10) Patent No.: US 6,627,467 B2
(45) Date of Patent: Sep. 30, 2003

(54) FLUID EJECTION DEVICE FABRICATION

(75) Inventors: Charles Haluzak, Corvallis, OR (US); Terry Mcmahon, Corvallis, OR (US); Donald W. Schulte, Corvallis, OR (US)

(73) Assignee: Hewlett-Packard Development Company, LP., Houston, TX (US)

( * ) Notice: Subject to any disclaimer, the term of this patent is extended or adjusted under 35 U.S.C. 154(b) by 6 days.

(21) Appl. No.: 10/003,780

(22) Filed: Oct. 31, 2001

(65) Prior Publication Data

US 2003/0082841 A1 May 1, 2003

(51) Int. Cl.$^{7}$ ................................................ H01L 21/00

(52) U.S. Cl. ............................... 438/21; 347/1; 347/20; 347/63

(58) Field of Search ............................... 438/21; 347/1, 347/20, 63

(56) References Cited

U.S. PATENT DOCUMENTS

| | | | | |
|---|---|---|---|---|
| 3,852,563 | A | | 12/1974 | Bohorquez .................. 219/216 |
| 4,438,191 | A | | 3/1984 | Cloutier et al. ............. 430/324 |
| 4,809,428 | A | | 3/1989 | Aden et al. .................... 29/611 |
| 4,847,630 | A | | 7/1989 | Bhaskar et al. .............. 346/1.1 |
| 4,851,371 | A | | 7/1989 | Fisher et al. ................ 437/226 |
| 4,875,968 | A | | 10/1989 | O'Neil et al. ............... 156/633 |
| 4,894,664 | A | | 1/1990 | Tsung Pan ................... 346/1.1 |
| 5,041,190 | A | | 8/1991 | Drake et al. ................ 156/647 |
| 5,160,577 | A | | 11/1992 | Deshpande ................. 156/644 |
| 5,194,877 | A | | 3/1993 | Lam et al. .................... 346/1.1 |
| 5,211,806 | A | | 5/1993 | Wong et al. ................ 156/644 |
| 5,306,370 | A | | 4/1994 | Herko et al. ................ 156/155 |
| 5,308,442 | A | | 5/1994 | Taub et al. ................. 156/644 |
| 5,317,346 | A | | 5/1994 | Garcia .................... 346/140 R |
| 5,478,606 | A | | 12/1995 | Ohkuma |
| 5,851,412 | A | | 12/1998 | Kubby ........................ 216/27 |
| 5,894,841 | A | | 4/1999 | Voges |
| 6,036,874 | A | | 3/2000 | Farnaam |
| 6,099,106 | A | | 8/2000 | Werner et al. ................ 347/20 |
| 6,113,221 | A | | 9/2000 | Weber |
| 6,137,443 | A | | 10/2000 | Beatty et al. ................. 343/63 |
| 6,153,114 | A | | 11/2000 | Figueredo et al. ............ 216/27 |
| 6,204,182 | B1 | * | 3/2001 | Truninger et al. .......... 438/691 |
| 6,241,333 | B1 | * | 6/2001 | Wen ............................ 347/15 |
| 6,283,582 | B1 | * | 9/2001 | Silverbrook ................. 347/54 |
| 6,365,058 | B1 | | 4/2002 | Beatty et al. ................. 216/27 |
| 6,390,606 | B1 | * | 5/2002 | Terui et al. ................... 347/63 |

FOREIGN PATENT DOCUMENTS

| | | | | |
|---|---|---|---|---|
| DE | 19536429 | A1 | 4/1997 | ............ B41J/2/135 |
| EP | 0244214 | A1 | 4/1987 | .............. B41J/3/04 |
| EP | 0 783 970 | | 6/1997 | |
| EP | 783970 | A2 | 7/1997 | .............. B41J/2/16 |
| EP | 0 814 380 | | 12/1997 | |
| JP | 5995156 | A | 10/1984 | .............. B41J/3/04 |
| JP | 0610098557 | | 5/1986 | .............. B41J/3/04 |
| JP | 62094347 | A | 4/1987 | .............. B41J/3/04 |
| JP | 0040052144 | | 2/1992 | .............. B41J/2/16 |

OTHER PUBLICATIONS

U.S. patent application Ser. No. 09/556,035; filed Apr. 20, 2000; Droplet Plate Architechture in Ink–Jet Printheads, Attorney reference 10981988–1.

* cited by examiner

*Primary Examiner*—John F. Niebling
*Assistant Examiner*—Christopher Lattin
(74) *Attorney, Agent, or Firm*—Lee & Hayes, PLLC

(57) ABSTRACT

A firing chamber is formed in a fluid ejection device. The firing chamber is substantially defined by a barrier layer and a thin film stack. The barrier layer is formed over the thin film stack. The thin film stack is on a substrate and defines the bottom of the firing chamber. A sacrificial layer is encapsulated between the thin film stack and the barrier layer. The sacrificial layer is removed.

23 Claims, 9 Drawing Sheets

146
136
134
132
130
128
124
116
112
114
148
150
154
150
152
149
146
136
134
132
130
128
124
116

FLUID EJECTION DEVICE FABRICATION

FIELD OF THE INVENTION

The present invention relates to the fabrication of a fluid ejection device.

BACKGROUND OF THE INVENTION

A fluid ejection device can be used in printing. An example of the use of a fluid ejection device in printing is a printhead for thermal ink jet printing. Thermal ink jet printing is often accomplished by heating fluid in a firing chamber of a printhead. Typically, the printhead is a semiconductor chip in which there are many firing chambers. The heated ink in each firing chamber forms a bubble. Formation of the bubble forces the heated ink out of a nozzle or orifice associated with the firing chamber towards a medium in a thermal ink jet printing operation. One common configuration of a thermal inkjet printhead is often called a roof shooter-type thermal ink jet printhead because the ink drop is ejected in a direction perpendicular to the plane of the thin films and substrate that comprise the semiconductor chip.

The firing chamber and the nozzles or orifices are typically fabricated in one of two fabrication modes. In the first fabrication mode, the nozzles or orifices are formed in a nozzle plate. The nozzle plate can also be referred to as an orifice layer. The orifice layer can be formed from polyimide or a nickel composition and is situated upon an ink barrier layer that defines the firing chamber. The ink barrier layer is typically composed of an organic material, such as polyimide. In the second fabrication mode, the nozzles or orifices are formed in a single material that is also used to define the firing chamber. This single material can be an organic material, a polymer material, or an organic polymer plastic.

Various problems can occur with respect to the foregoing two fabrication modes for the nozzles and firing chamber. One of the problems arises due to the chemical conditions present in ink jet printing when the firing chamber is fed ink through a slot that originates in the backside of the printhead. The slot is created during fabrication by an etch of the backside of a wafer. The etchant chemistry used to form the slot can have a deleterious effect upon the nozzles or orifices being fabricated, such as over or under etching leading to potential delamination problems.

Other chemically related problems occur in the fabrication of the firing chamber and orifice structures. When the firing chamber and orifice structures are constructed from multiple layers, there are a number of interfaces that are susceptible to chemical attack by the corrosive nature of the ink used in thermal ink jet printing.

In either of the foregoing two fabrication modes, the materials used may not be inherently robust so as to withstand attack from the range of ink chemistries used in thermal inkjet printing. For instance, when a polymer barrier layer is used to define the firing chamber, there can be problems due to the absorption of ink. When the polymer in the polymer barrier layer absorbs ink, the polymer barrier layer tends to swell, chemically degrade, and thermally oxidize or otherwise to form unwanted compounds that are deleterious to the ink jet printhead during field use. When the corrosive ink contacts underlying electrically conductive layers in the printhead, the ink will corrode the conductive layers, resulting in increased electrical resistance and leading eventual failure. In severe cases an entire power supply bus to the printhead may be corroded, resulting in the printhead failing.

Design constraints are often used in the selection of the thickness of the materials that are used to fabricate the nozzles or orifices and the firing chamber in either of the foregoing two fabrication modes. For fluidic reasons, material thicknesses are design constraints that are selected so as to control the volume of a drop of vaporized ink that is ejected out of the nozzle or orifice from the firing chamber. Design constraints can also achieve accurate alignment and placement of the nozzles or orifices in the printhead than can otherwise be achieved by a pick-and-place process using machine vision.

Accordingly, it is desired to protect fluid ejection devices, such as printheads, during fabrication and in the field, and to control the dimensions of the fluid ejection device during fabrication.

SUMMARY OF THE INVENTION

In one embodiment, a firing chamber of a fluid ejection device is formed. The firing chamber is substantially defined by a barrier layer and a thin film stack. The barrier layer is formed over the thin film stack. The thin film stack is on a substrate. The thin film stack defines the bottom of the firing chamber. A sacrificial layer is encapsulated between the thin film stack and the barrier layer. The sacrificial layer is removed.

These and other features of the present invention will become more fully apparent from the following description and appended claims, or may be learned by the practice of the invention as set forth hereinafter.

DESCRIPTION OF THE DRAWINGS

To further clarify the above and other advantages of the present invention, a particular description of the invention will be rendered by reference to specific embodiments thereof which are illustrated in the appended drawings. The same numbers are used throughout the drawings to reference like features and components. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

An illustration for presenting an implementation of the method of the invention is seen in FIGS. 1–6, where integrated circuit wafer fabrication materials and processes are used to fabricate a TIJ printhead including a firing chamber, a resistor for electrical resistance heating of the firing chamber, a nozzle or orifice associated with the firing chamber of the TIJ printhead, and related circuitry.

Figure 1:
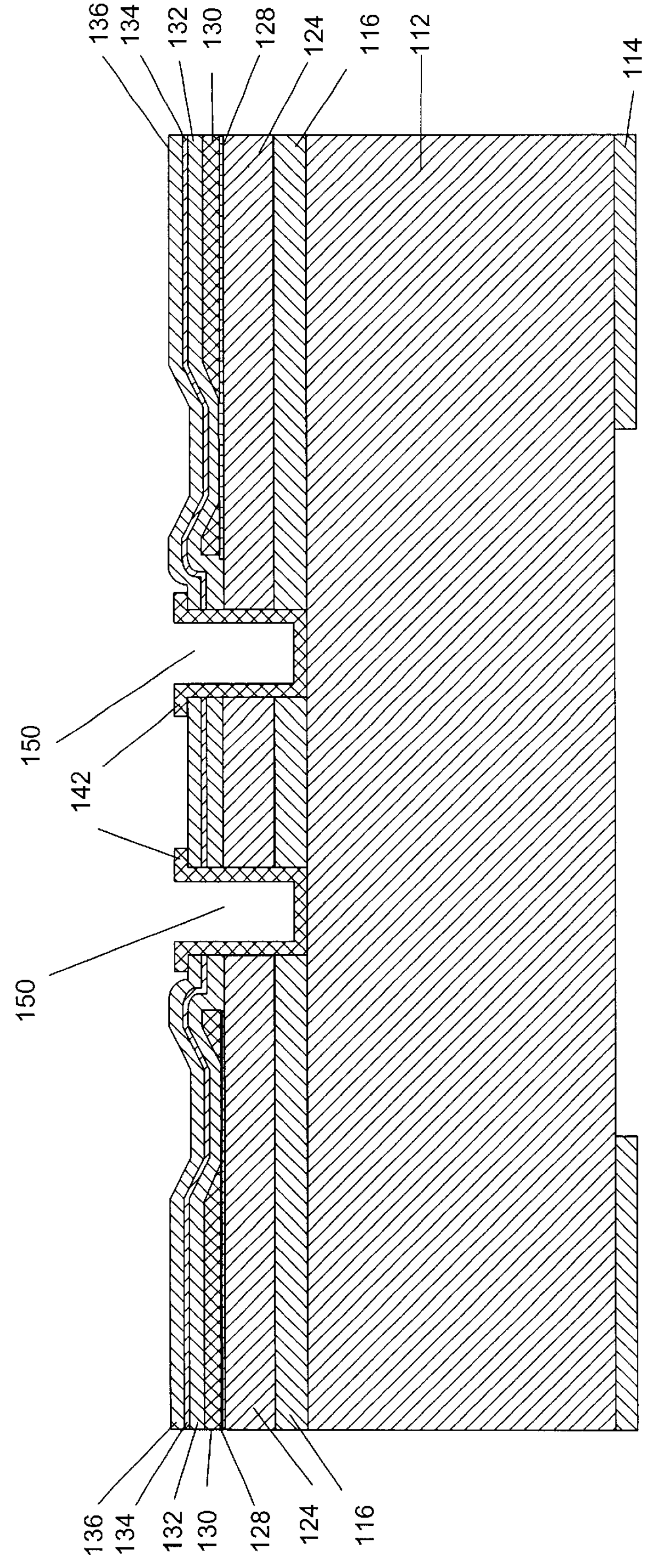
FIG. 1 is a cross-sectional view of an implementation of the disclosed invention in which integrated circuit wafer fabrication materials and processes are used in the manufacture of a Thermal Ink Jet (TIJ) printhead and in which die are fabricated, wherein the depicted structure includes a sacrificial passivation layer that will be removed in the formation of firing chambers and respective orifices thereto, and where the backside of a semiconductor substrate has a protective passivation layer thereon.

FIG. 1 shows a semiconductor substrate 112 having first and second passivation layers 114 and 116 on opposite sides thereof. In one embodiment, semiconductor substrate 112 is a semiconductor substrate. The term "semiconductor substrate" includes semiconductive material. The term is not limited to bulk semiconductive material, such as a silicon wafer, either alone or in assemblies comprising other materials thereon, and semiconductive material layers, either alone or in assemblies comprising other materials. The term "substrate" refers to any supporting structure including but not limited to the semiconductor substrates described above. A substrate may be made of silicon, glass, gallium arsenide, silicon on sapphire (SOS), epitaxial formations, germanium, germanium silicon, diamond, silicon on insulator (SOI) material, selective implantation of oxygen (SIMOX) substrates, and/or like substrate materials. Preferably, the substrate is made of silicon, which is typically single crystalline.

A dielectric layer 124 is upon second passivation layer 116. Each of the dielectric layer 124 and the first and second passivation layers 114, 116 are preferably composed of a wet or dry process silicon dioxide ($SiO_2$), tetraethylorthosilicate ($(SiOC_2H_5)_4$) (TEOS) based oxides, borophosphosilicate glass (BPSG), phosphosilicate glass (PSG), or borosilicate glass (BSG).

A resistor material 128 is seen in FIG. 1 upon dielectric layer 124. Resistor material 128 is preferably composed of an alloy of tantalum and aluminum, although other materials can be used, such as tantalum nitride, hafnium boride, and tungsten silicon nitride. In fluid ejection devices such as a thermal ink jet (TIJ) printhead, resistor material 128 is used in electrical resistance heating of a firing chamber to vaporize ink in the firing chamber.

A metal layer 130, preferably composed of aluminum or an aluminum alloy, is deposited on top of resistor 128 and portions of metal layer 130 are selectively removed to form heater resistors. First and second insulators layers 132, 134, preferably composed of silicon nitride (e.g. $Si_3N_4$) and silicon carbide (e.g. SiC), respectively, are seen above resistor material 128 and metal layer 130. A first barrier or cavitation barrier layer 136, which can be composed of a refractory metal such as tantalum or a tantalum-aluminum alloy, is seen in FIG. 1 as being upon second insulator layer 134.

A dielectric material is seen in FIG. 1 as a pair of sacrificial passivation layers 142. Sacrificial passivation layers 142 are preferably composed of silicon dioxide or other sacrificial material such as spin-on glass (SOG). Sacrificial passivation layers 142 are each seen in FIG. 1 as having a U-shape within a respective pair of voids 150. In forming the depicted sacrificial passivation layers 142 seen in FIG. 1, a material is deposited and patterned so as to provide front side protection of the structure illustrated. The purpose of sacrificial passivation layers 142 is to increase yield by protecting the front side of the semiconductor substrate 112 when an etch, such as a tetra methyl ammonium hydroxide (TMAH) wet silicon etch, is conducted through the back side of semiconductor substrate 112. When a dry etch of the back side of semiconductor substrate 112 is performed instead of a wet etch, sacrificial passivation layers 142 are optional.

Figure 2:
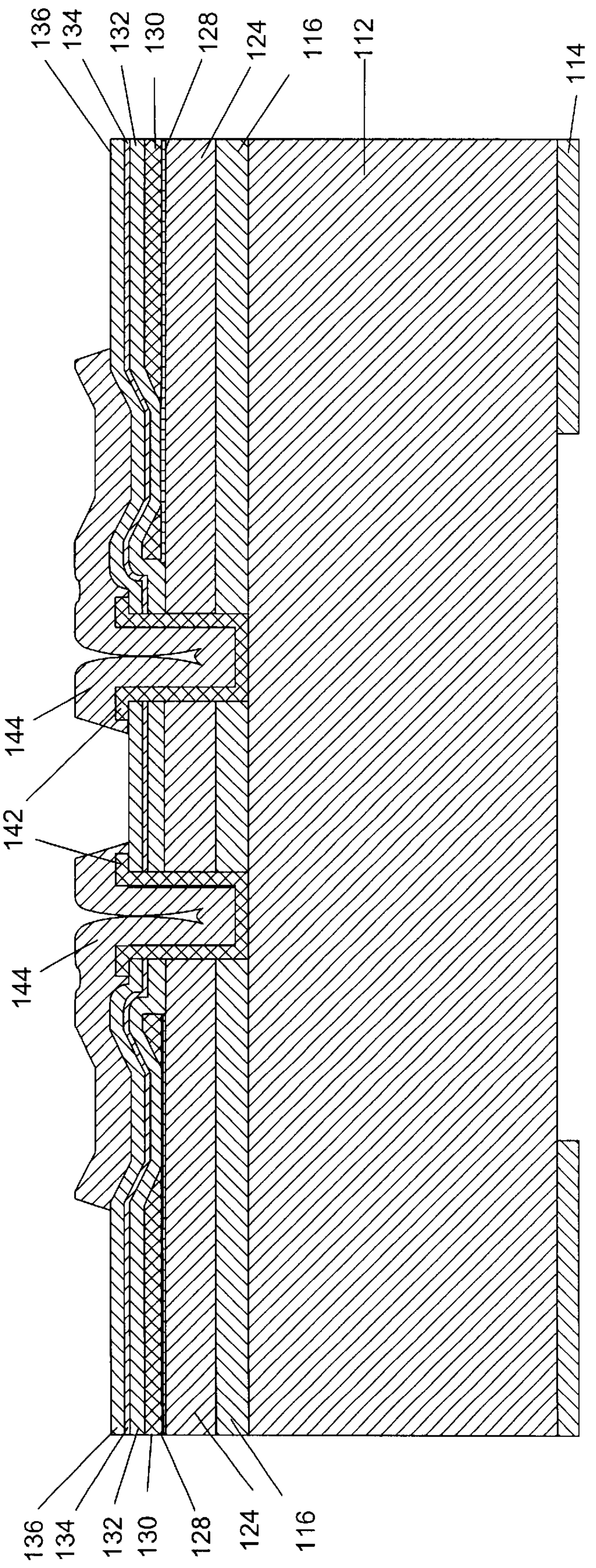
FIG. 2 is a cross-sectional view of the structure seen in FIG. 1 after further processing in which sacrificial metal layers partially define the firing chambers of a printhead are deposited and patterned.

FIG. 2 shows FIG. 1 after further processing in which there is deposited and patterned a "lost wax" or sacrificial material that will be used in partially defining the firing chamber of the TIJ printhead. This material is seen in FIG. 2 as a sacrificial metal layer 144 which is preferably composed of aluminum or polysilicon. Sacrificial metal layer 144 will preferably be deposited over the entire semiconductor substrate 112 and then patterned so that the remaining sacrificial metal layer 144 will partially define the inside volume of the firing chamber of the TIJ printhead. Depending on the topography and the thickness of sacrificial metal layer 144, planarization of sacrificial metal layer 144 may be needed, such as by conventional mechanical, resist etch-back, or chemical-mechanical processes.

Figure 3:
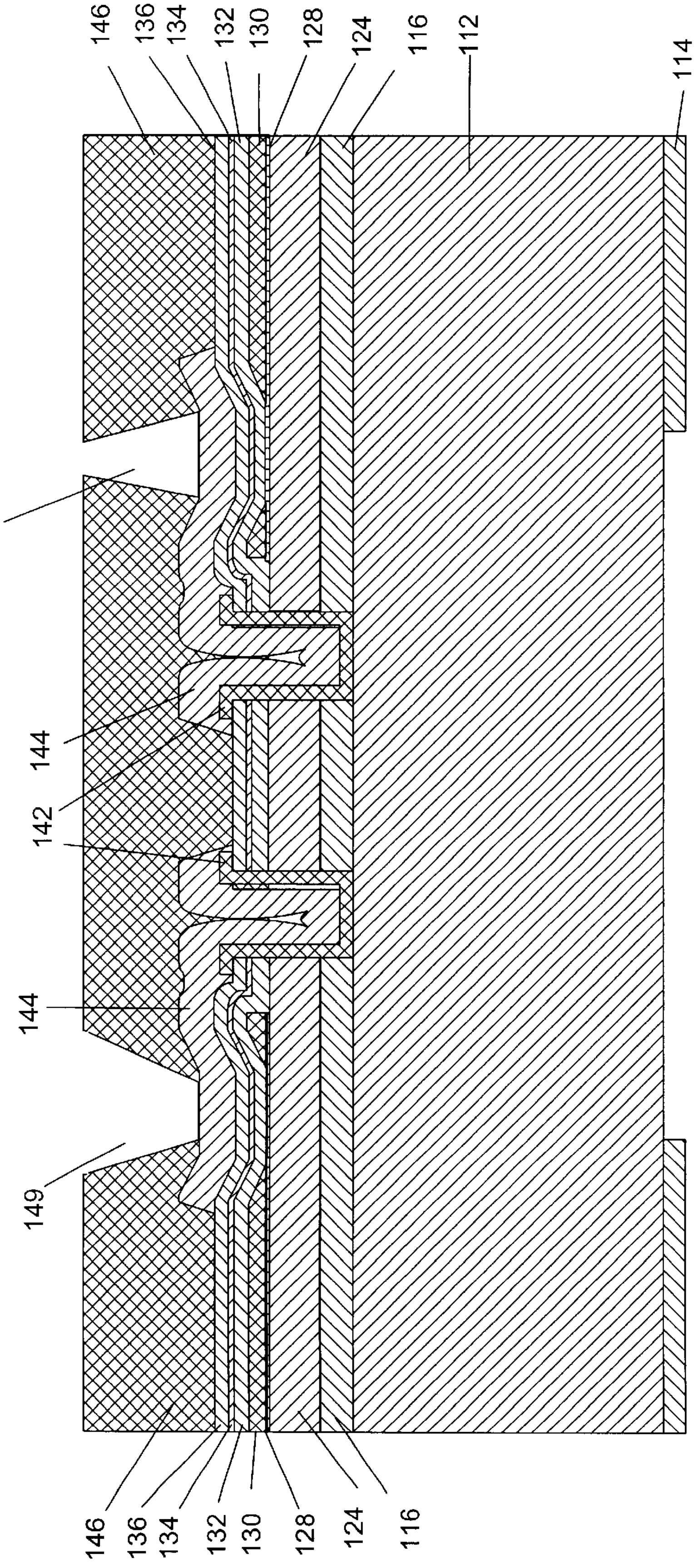
FIG. 3 is a cross-sectional view of the structure seen in FIG. 2 after further processing in which a passivation layer is formed over the sacrificial metal layer and a pair of vias are etched to form a respective pair of nozzles in the passivation layer.

A barrier material is then deposited over the thin film stack depicted in FIG. 3. The barrier material is seen as a third passivation layer 146 in FIG. 3. Third passivation layer 146 is situated over the sacrificial metal layer 144 and the entire surface of the semiconductor substrate 112. Third passivation layer 146 can be composed of a stress-graded dielectric such as silicon dioxide, variable in its composition (stress) throughout the thickness thereof, and may be planarized by conventional processes, if desired, to improve flatness of the top surface thereof. A via etch of third passivation layer 146 can form either a reentrant TIJ nozzle 148 or a non-reentrant nozzle 149. Preferably, nozzles 148, 149 will have the same shape in any one structure in which they are being fabricated.

Figure 4:
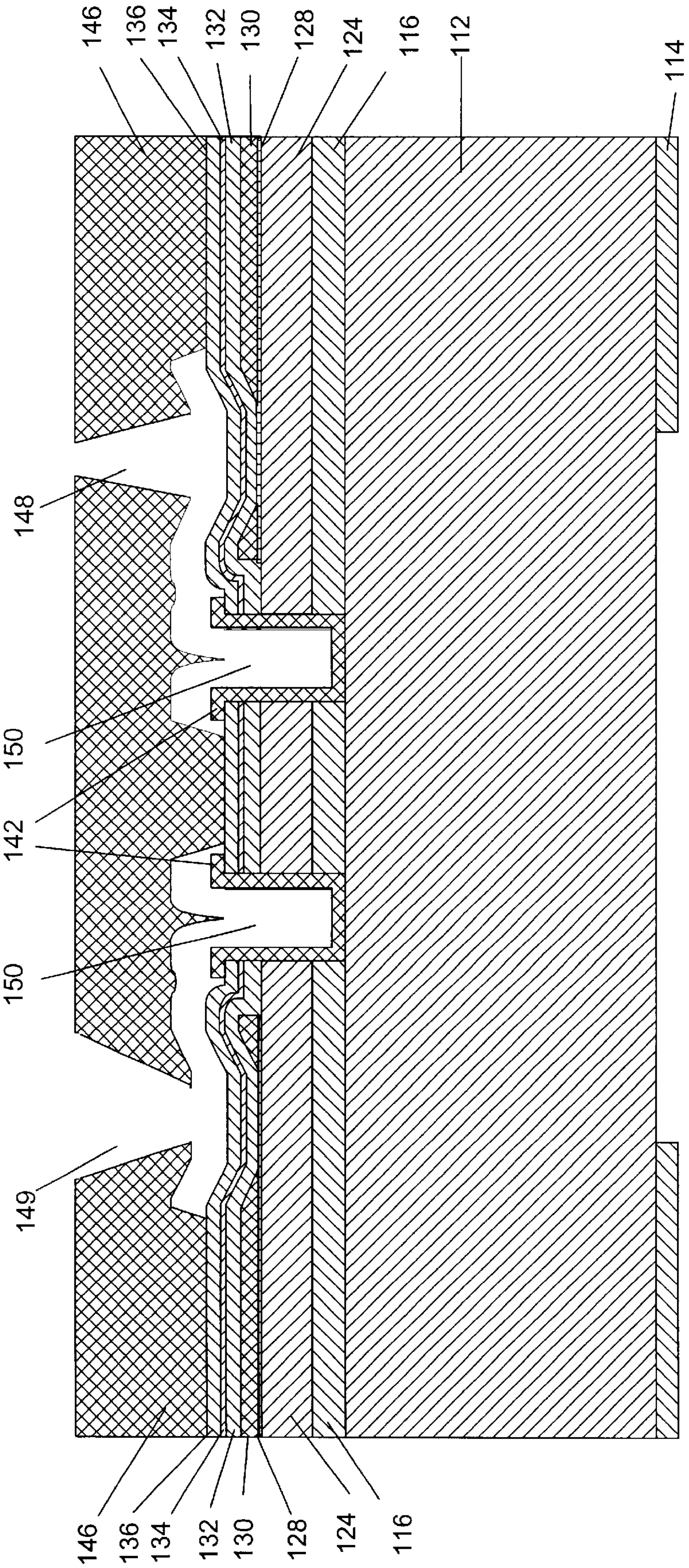
FIG. 4 is a cross-sectional view of the structure seen in FIG. 3 after further processing in which an etch removes the sacrificial metal layer.

FIG. 4 illustrates the result of a removal of the "lost wax" or sacrificial layer where sacrificial metal layer 144, seen in FIG. 3, is no longer seen in FIG. 4. Rather, FIG. 4 shows a pair of voids 150 that are the beginning of the partial definition of respective firing chambers of the TIJ printhead. Voids 150 are laterally offset, respectively, from nozzles 148, 149. Sacrificial metal layer 144 will preferably be removed by an etch that is highly selective to third passivation layer 146, sacrificial passivation layer 142 if present, and cavitation barrier layer 136. An etchant for this purpose will preferably be sulfuric peroxide and/or sodium hydroxide for an aluminum sacrificial material, or TMAH for a polysilicon sacrificial material.

Figure 5:
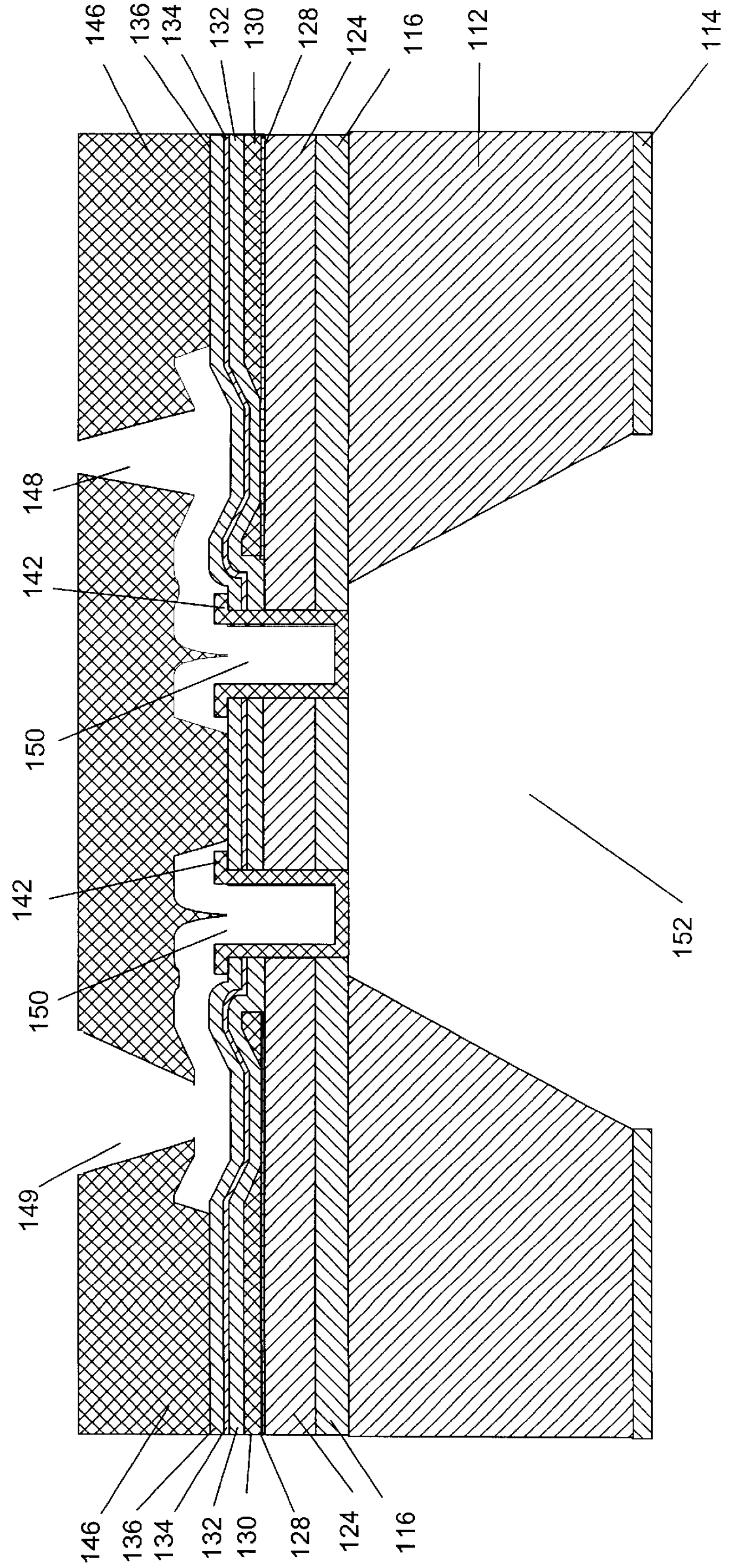
FIG. 5 is a cross-sectional view of the structure seen in FIG. 4 after further processing in which an opening is formed through the backside of the semiconductor substrate.
Figure 6:
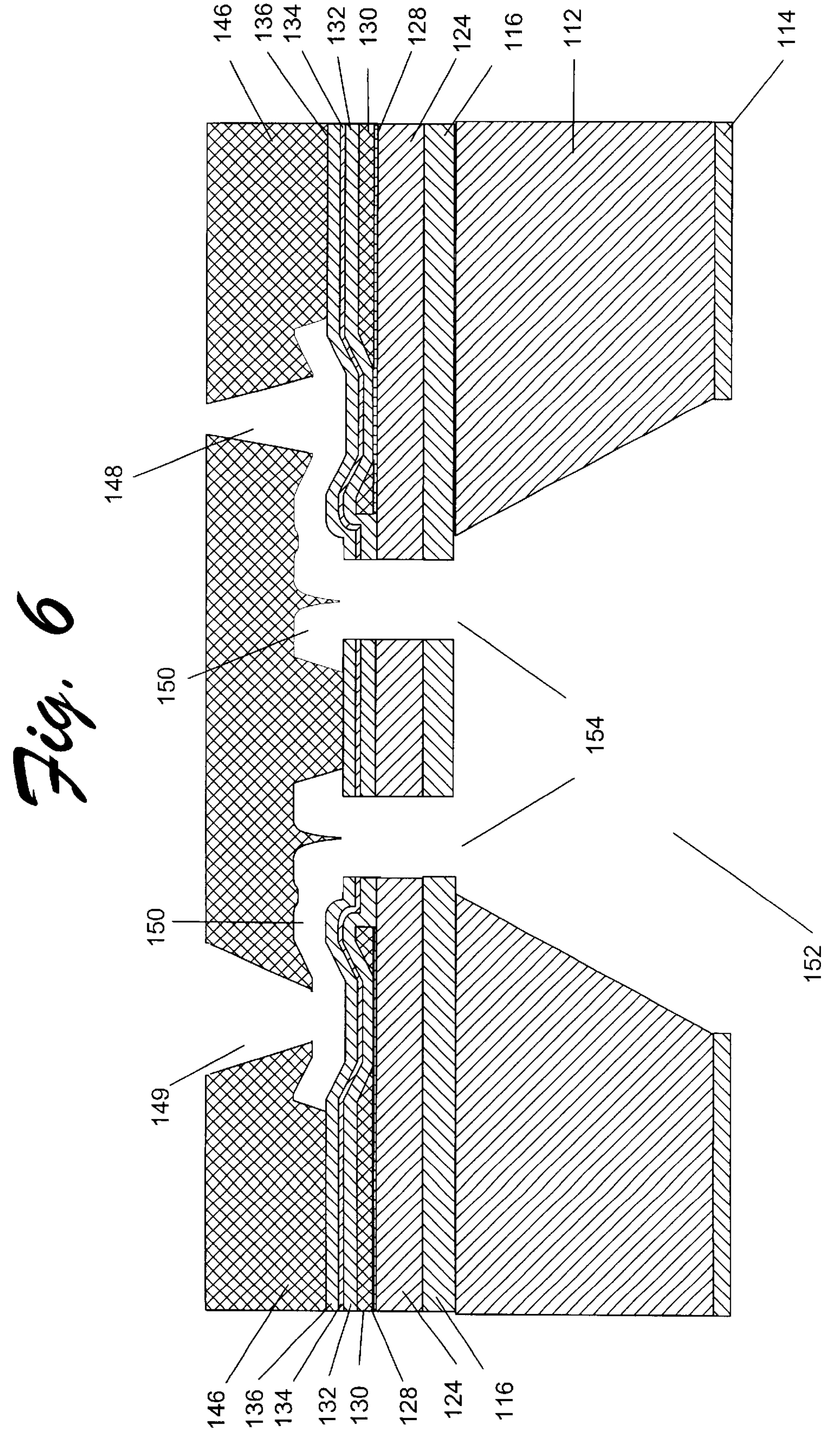
FIG. 6 is a cross-sectional view of the structure seen in FIG. 5 after further processing in which the sacrificial passivation layer is removed to open a fluidic channel to the nozzles in the passivation layer.

In FIG. 5, the results of an etch through the back side of semiconductor substrate 112 are seen. The etch can use either a wet or dry etch chemistry. A dry etch may be preferred in that the dry etch would produce vertical or orthogonal sidewalls in semiconductor substrate 112. The etch through the back side of semiconductor substrate 112 creates a backside opening 152. FIG. 6 shows the removal of the optional sacrificial passivation layers 142 that open fluid communication from ink feed slots 154 in backside opening 152 through voids 150 to nozzles 148, 149 and thereby establishing a fluidic channel.

Figure 7:
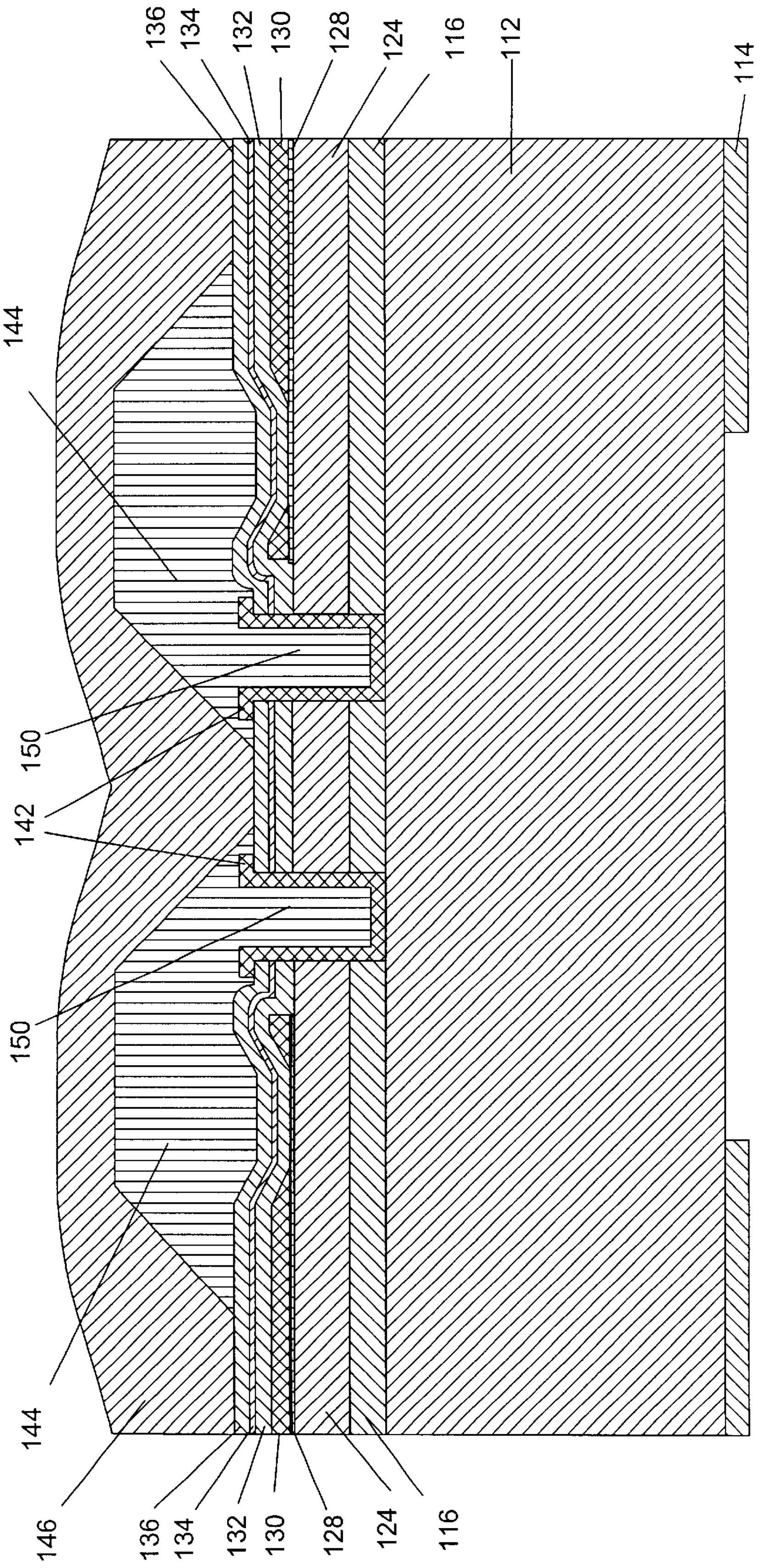
FIG. 7 is a cross-sectional view of the structure seen in FIG. 1 after further processing, including the definition of a pair of sacrificial bumps upon an underlying dielectric layer and the formation of an ink barrier layer over the sacrificial bumps.
Figure 8:
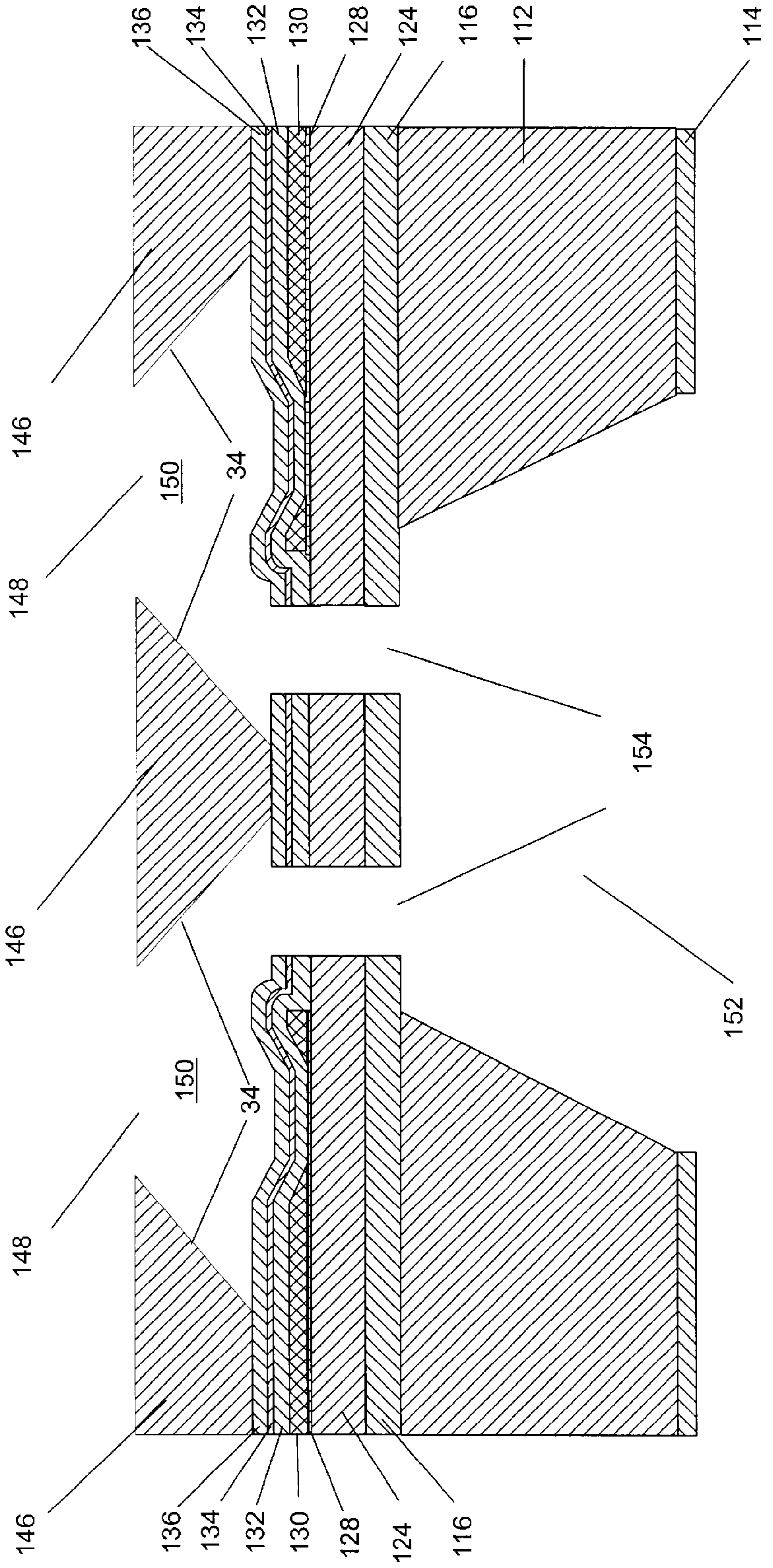
FIG. 8 is a cross-sectional view of the structure seen in FIG. 7 after further processing in which the ink barrier layer is planarized to expose the pair of sacrificial bumps, and an etch of the ink barrier layer and the semiconductor substrate forms respective side walls while removing the sacrificial bumps and leaving a resistor portion of the TIJ printhead intact.

FIGS. 7–8 illustrate further processing of the structure seen in FIG. 1 in another embodiment of the invention in which a sacrificial material is encapsulated in a barrier layer. The sacrificial material is used to partially define the inside volume of a firing chamber. The sacrificial material is deposited over the structure seen in FIG. 1 and within the pair of voids 150. The sacrificial material is then patterned to form a pair of bumps 144 as seen in FIG. 7. FIG. 7 also shows the result of a deposition of a third passivation layer 146, such as by silicon dioxide deposition. The deposition will preferably be plasma enhanced chemical vapor deposition (PECVD) having a thickness in a range from about 1 micron to about 20 microns, and will situate third passivation layer 146 conformally over the pair of bumps 144 and upon first barrier or cavitation barrier layer 136.

The result of a removal of the pair of bumps 144, a portion of semiconductor substrate 112, a portion of first passivation layer 114, and sacrificial passivation layers 142 is seen in FIG. 8. The removed materials form passageways through semiconductor substrate 112 into ink-feed slots 154, and form orifices or nozzles 148 extending through third passivation layer 146. Each nozzle 148 can have sloped side walls 34.

The structure seen in FIG. 8 can be accomplished in several ways. A planarization of third passivation layer 146 can be undertaken, such as by etch-back or chemical mechanical planarization (CMP), so as to expose the pair of bumps 144. A selective etch process is then used to remove the pair of bumps 144. The planarization process exposes an entrance to each nozzle 148 by exposing the pair of bumps 144 underneath third passivation layer 146 seen in FIG. 7. CMP is a preferred process in that accuracy of the resultant thickness of third passivation layer 146 can be achieved to about plus or minus 800 Angstroms.

A back-side slot etch of semiconductor substrate 112, followed by a selective etch to remove sacrificial passivation layers 142, is then conducted to form backside opening 152 through the semiconductor substrate 112 and to open up the ink feed slots 154 to voids 150 and out to the nozzles 148. Where semiconductor substrate 112 is composed of silicon, an etchant such as tetra methyl ammonium hydroxide (TMAH) can be used to etch through the silicon. If preferred, a dry etch can also be used to etch through the silicon and would result in vertical or orthogonal sidewalls in semiconductor substrate 112, which may be desirable in some applications.

Figure 9:
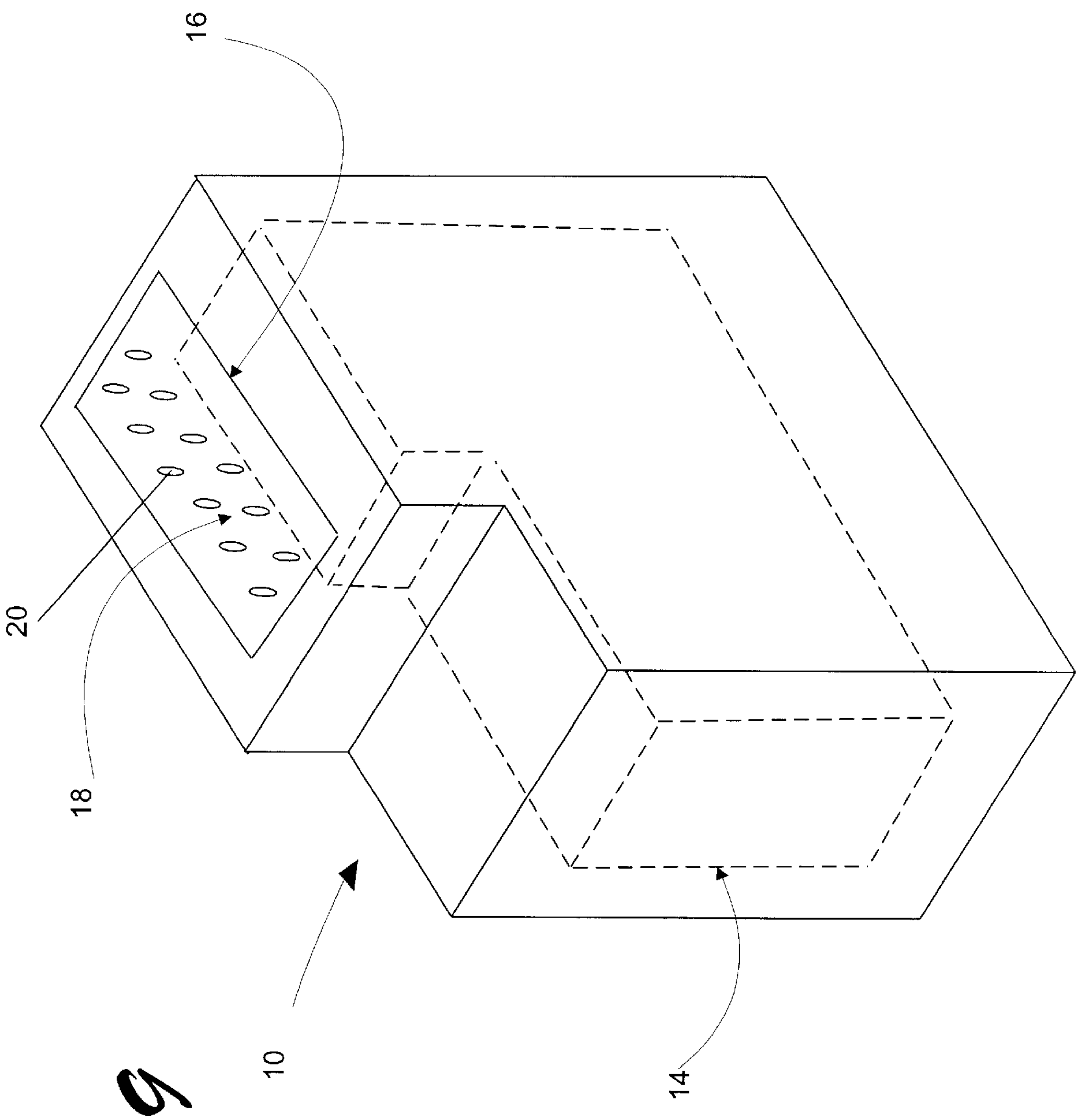
FIG. 9 is a perspective view of an embodiment of the disclosed invention in which a print cartridge has a printhead in accordance with the present invention.

The method of the invention includes the making a fluid ejection device as well as the making of a print cartridge that incorporates or is otherwise associated with a fluid ejection device. By way of example, FIG. 9 illustrates a print cartridge 10 of the present invention. A fluid ejection device, seen in FIG. 9 as a printhead 16, is a component of the print cartridge 10 as seen on a surface thereof. A fluid reservoir 14, depicted in phantom within print cartridge 10 in FIG. 9, contains a fluid that is supplied to printhead 16. A plurality of nozzles 20 on printhead 16 are also seen in FIG. 9.

The method of the invention includes the making a print cartridge in which a fluid chamber is formed. The fluid chamber is for containing a volume of ink needed in a printing process. A fluid ejection device, such as a printhead, is formed so as to be fluidically coupled with the fluid chamber. The fluid ejection device will preferably be fabricated using integrated circuit fabrication processes, wherein a thin film stack is formed upon a substrate such as a semiconductor substrate. The thin film stack includes a resistive material. A barrier layer that will substantially define a firing chamber is deposited over the thin film stack. The thin film stack defines the bottom of the firing chamber. A sacrificial layer is substantially encapsulated between the thin film stack and the barrier layer. A void is formed within the barrier layer by removing the sacrificial layer and thereby partially defining the firing chamber. The resistive material in the thin film stack is situated under the firing chamber. In operation, the resistive material heats a droplet of ink that is in the firing chamber so as to vaporize the droplet. The vaporized droplet is thereby ejected from the firing chamber.

Embodiments of the invention are disclosed herein for forming a fluid ejection device having a firing chamber and a nozzle that are in formed silicon dioxide by the removal of a material that is encapsulated within the silicon dioxide. When silicon dioxide is so used, a broader range of chemistries in fabrication processing can be used than is conventional. Silicon dioxide is inert to a TMAH etchant in an etch process applied to the back side of the semiconductor substrate for the purpose of forming a slot for communicating ink to the firing chamber. Preferably, the nozzles for the fluid ejection device will be formed before the back side etch of the semiconductor substrate. Silicon dioxide is resistant to chemical degradation and is not absorbent, unlike polymers that absorb and swell when used as an ink barrier. Polymers are also prone to problems of thermal oxidation or otherwise forming unwanted compounds that are deleterious to fluid ejection devices such as printheads.

In another embodiment of the invention, planarization is used to form openings that serve as nozzles for a fluid ejection device, such as a printhead. The planarization process so used can obtain higher than conventional thickness control. Each embodiment will preferably use integrated circuit fabrication processes for alignment and placement properties. These processes are inherently more accurate in controlling dimensions by photolithographic processes and the like, as compared to conventional pick-and-place processing using machine vision.

Other embodiments of the invention disclosed herein for forming a fluid ejection device effectively reduce the number of interfaces that can be attacked by the corrosive ink in the firing chamber, where a firing chamber is partially formed by removal of a material within a barrier layer. Moreover, embodiments of the invention disclosed herein can accomplish the result of reducing the cost of printhead fabrication as well as increasing fabrication yield by requiring less processing. The lower fabrication costs for printheads in turn lower the cost per printed page.

It should be recognized that, in addition to the thermal ink jet printhead embodiments described above, this invention is also applicable to alternative digital printing and drop formation technologies including: medical devices, mechanically actuated drop ejection, such as piezoelectric, electrostatic, and magnetic and, piezo-flextensional drop ejection.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of forming a firing chamber of a fluid ejection device, wherein the firing chamber is substantially defined by a barrier layer and a thin film stack, the barrier layer is formed over the thin film stack, the thin film stack is on a substrate, and the thin film stack defines the bottom of the firing chamber, the method comprising:

encapsulating a sacrificial layer in between the thin film stack and the barrier layer;

removing the sacrificial layer between the thin film and the barrier layer; and forming an opening from a top surface of the barrier layer to the sacrificial layer by planarizing the barrier layer.

2. The method as defined in claim 1, wherein removing the sacrificial layer comprises etching the sacrificial layer selective to:

the barrier layer; and a resistor material in the thin film stack.

3. The method as defined in claim 1, wherein the forming an opening further comprises forming the opening to extends from a surface on the substrate, through the thin film stack, and to the firing chamber.

4. A method of forming a firing chamber of a fluid ejection device, wherein the firing chamber is substantially defined by a barrier layer and a thin film stack, the barrier layer is formed over the thin film stack, the thin film stack is on a substrate, and the thin film stack defines the bottom of the firing chamber, the method comprising:

encapsulating a sacrificial layer in between the thin film stack and the barrier layer:

forming a re-entrant nozzle extending from a top surface of the barrier layer to the sacrificial layer by planarizing;

removing the sacrificial layer between the thin film stack and the barrier layer: and forming a fluidic channel from a surface on the substrate, through the thin film stack, and to the firing chamber.

5. The method as defined in claim 1, wherein the barrier layer is an inorganic material.

6. The method as defined in claim 1, wherein:

the barrier layer comprises silicon dioxide; and the sacrificial layer comprises a material selected from the group consisting of aluminum and polysilicon.

7. A method of forming a firing chamber of a fluid ejection device, wherein the firing chamber is substantially defined by a barrier layer and a thin film stack, the barrier layer is formed over the thin film stack, the thin film stack is on a semiconductor substrate, and the thin film stack defines the bottom of the firing chamber, the method comprising:

forming a recess in the thin film stack that exposes the semiconductor substrate;

forming a dielectric layer within the recess;

forming a sacrificial material within the recess on the dielectric layer;

forming the barrier layer over the thin film stack and the sacrificial material;

forming a nozzle in the baffler layer extending from an exposed surface on the baffler layer to the sacrificial material;

forming a void by removing the sacrificial material, the void being in fluid communication with the nozzle and substantially defining the firing chamber; and forming a channel extending through the semiconductor substrate and the thin film stack to the nozzle by removing the dielectric layer and a portion of the semiconductor substrate.

8. The method as defined in claim 7, wherein the nozzle is formed by chemical mechanical planarization of the baffler layer so as to expose the sacrificial material.

9. The method as defined in claim 7, wherein the void within the baffler layer is laterally offset from the nozzle.

10. The method as defined in claim 7, wherein:

the dielectric material is selected from the group consisting of silicon dioxide and spin-on glass (SOG);

the barrier layer comprises silicon dioxide; and the sacrificial material is selected from the group consisting of aluminum and polysilicon.

11. The method as defined in claim 7, wherein the recess in the thin film stack that exposes the semiconductor substrate is defined by:

a second material over a first material each being selected from the group consisting of wet or dry process silicon dioxide ($SiO_2$), tetraethylorthosilicate ($(SiOC_2H_5)_4$) (TEOS) based oxides, borophosphosilicate glass (BPSG), phosphosilicate glass (PSG), and borosilicate glass (BSG);

a third material over the second material and comprising silicon nitride;

a fourth material over the third material and comprising silicon carbide; and a fifth material over the fourth material and comprising a refractory metal or alloy thereof.

12. A method for fabricating a fluid ejection device, the method comprising:

forming a pair of voids in a thin film stack over a semiconductor substrate, the thin film stack including a resistor material between the pair of voids;

forming a pair of dielectric layers respectively within the pair of voids;

forming a pair of sacrificial materials respectively over the pair of dielectric layers;

forming a barrier layer over the thin film stack and the pair of sacrificial materials;

forming a pair of nozzles in the barrier layer extending, respectively, to the pair of sacrificial materials;

removing the pair of sacrificial materials respectively through the pair of nozzles to substantially define a pair of firing chambers for being heated by the resistor material; and removing a portion of the semiconductor substrate and the pair of dielectric layers respectively within the pair of voids to form a channel in fluid communication with the pair of firing chambers and a surface on the semiconductor substrate.

13. The method as defined in claim 12, wherein:

the portion of the semiconductor substrate is removed by etching;

the pair of nozzles are formed by chemical mechanical planarization of the barrier layer so as to expose the pair of sacrificial materials; and the pair of sacrificial materials comprises a material selected from the group consisting of aluminum and polysilicon.

14. A method of forming a plurality of firing chambers of a fluid ejection device within a barrier layer over a thin film stack on a semiconductor substrate, wherein the thin film stack and the barrier layer substantially define, respectively, the bottom and top of each said firing chamber, the method comprising:

forming a plurality of recesses in the thin film stack each exposing the semiconductor substrate;

forming a plurality of patterned dielectric materials respectively within the plurality of recesses;

forming a plurality of patterned sacrificial materials respectively within the plurality of recesses and respectively over the plurality of patterned dielectric materials;

forming the barrier layer over the plurality of patterned sacrificial materials and upon a top surface of the thin film stack between each said recess;

forming a plurality of nozzles within the barrier layer each extending to expose a surface on a respective one of said patterned sacrificial materials; and forming a plurality of voids within the barrier layer by removing each said patterned sacrificial material through a respective one of the nozzles, wherein each said void:

extends to a bottom surface of a respective one of the patterned dielectric materials within a respective one of the recesses; and is separated from another said void by a portion of the thin film stack;

forming a channel extending through the semiconductor substrate and in fluid communication with each said nozzle and each said void by removing:

the plurality of patterned dielectric materials respectively within the plurality of recesses; and a portion of the semiconductor substrate.

15. The method as defined in claim 14, wherein each said void is respectively asymmetric with respect to the corresponding recess.

16. The method as defined in claim 14, wherein:

each said patterned dielectric material comprises silicon dioxide;

each said patterned sacrificial material is selected from the group consisting of aluminum and polysilicon; and the barrier layer comprises silicon dioxide.

17. The method as defined in claim 14, wherein each said recess in the thin film stack is defined by:

a second material over a first material each being selected from the group consisting of wet or dry process silicon dioxide ($SiO_2$), tetraethylorthosilicate ($(SiOC_2H_5)_4$) (TEOS) based oxides, borophosphosilicate glass (BPSG), phosphosilicate glass (PSG), and borosilicate glass (BSG);

a third material over the second material and comprising silicon nitride;

a fourth material over the third material and comprising silicon carbide; and a fifth material over the fourth material and comprising a refractory metal or alloy thereof.

18. A method of forming a fluid ejection device, the method comprising:

forming a thin film stack including a resistor material over a semiconductor substrate;

forming a sacrificial layer over the thin film stack;

forming a barrier layer over the sacrificial layer on thin film stack removing a portion of the barrier layer by a chemical-mechanical planarization process to expose a surface of the sacrificial layer; and defining a firing chamber, for heating with the resistor material and situated between the barrier layer and the thin film stack, by removing the sacrificial layer selective to the barrier layer.

19. The method as defined in claim 18, wherein the barrier layer is composed of silicon dioxide.

20. The method as defined in claim 18, wherein:

the removing a portion of the barrier layer forms a passageway in the barrier layer; and the removing the sacrificial layer selective to the barrier layer includes removing the sacrificial layer through the passageway in the barrier layer.

21. The method as defined in claim 18, further comprising removing portions of the semiconductor substrate and the thin film stack to define a is passageway to the firing chamber.

22. A method of making print cartridge, the method comprising:

forming a fluid chamber; and forming a fluid ejection device, fluidically coupled with the fluid chamber, by:

forming a thin film stack including a resistor material over a semiconductor substrate;

forming a sacrificial layer over the thin film stack;

forming a barrier layer comprising silicon dioxide over the sacrificial layer on thin film stack;

removing a portion of the barrier layer by a planarizing process to expose a surface of the sacrificial layer;

defining a firing chamber, situated between the barrier layer and the thin film stack, by removing the sacrificial layer selective to the barrier layer, wherein the resistive material is under the firing chamber and is capable of heating fluid in the firing chamber so as to vaporize and thereby eject fluid from the firing chamber; and forming a channel extending from a surface on the semiconductor substrate, through the semiconductor substrate, and in fluidic communication with the firing chamber.

23. The method as defined in claim 4, wherein the fluidic channel is formed by planarizing.

* * * * *

UNITED STATES PATENT AND TRADEMARK OFFICE

CERTIFICATE OF CORRECTION

PATENT NO. : 6,627,467 B2 
DATED : September 30, 2003
INVENTOR(S) : Haluzak et al.

It is certified that error appears in the above-identified patent and that said Letters Patent is hereby corrected as shown below:

<u>Column 7</u>,
Line 27, delete “extends” and insert in lieu thereof -- extend --;
Lines 65 and 66, after “forming a nozzle in the” delete “baffler” and insert in lieu thereof -- barrier --;

<u>Column 8</u>,
Line 10, delete “baffler” and insert in lieu thereof -- barrier --;
Line 12, after “within the” delete “baffler” and insert in lieu thereof -- barrier --;

<u>Column 10</u>,
Line 30, after “to define a” delete “is”.

Signed and Sealed this

Sixteenth Day of December, 2003

JAMES E. ROGAN
*Director of the United States Patent and Trademark Office*